(12) United States Patent
Nakamura et al.

(10) Patent No.: US 7,138,809 B2
(45) Date of Patent: Nov. 21, 2006

(54) ELECTRICAL CAPACITANCE PROXIMITY SENSOR

(75) Inventors: Yasushi Nakamura, Sakura (JP); Fumio Yajima, Sakura (JP); Nobumasa Misaki, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/127,244

(22) Filed: May 12, 2005

(65) Prior Publication Data

US 2005/0264304 A1 Dec. 1, 2005

(30) Foreign Application Priority Data

May 14, 2004 (JP) .............................. 2004-145502

(51) Int. Cl.
*G01R 27/26* (2006.01)
(52) U.S. Cl. .................. 324/681; 324/627; 324/658
(58) Field of Classification Search ................ 324/681, 324/627, 688, 690
See application file for complete search history.

(56) References Cited

U.S. PATENT DOCUMENTS

| | | | | |
|---|---|---|---|---|
| 4,766,368 A | * | 8/1988 | Cox ............................ | 324/688 |
| 5,223,796 A | * | 6/1993 | Waldman et al. ........... | 324/687 |
| 5,227,667 A | * | 7/1993 | Takinami et al. ........... | 307/129 |
| 5,512,836 A | * | 4/1996 | Chen et al. .................. | 324/687 |
| 5,917,314 A | * | 6/1999 | Heger et al. .................. | 324/67 |
| 6,724,324 B1 | * | 4/2004 | Lambert ....................... | 34/133 |
| 6,894,507 B1 | * | 5/2005 | Morimoto ................... | 324/661 |

* cited by examiner

*Primary Examiner*—Anjan Deb
*Assistant Examiner*—John Zhu
(74) *Attorney, Agent, or Firm*—Sughrue Mion, PLLC

(57) ABSTRACT

An electrical capacitance proximity sensor with high detector sensitivity has an insulating substrate, a detector electrode and an earth electrode formed in a fixed pattern on one face of the insulating substrate, and a detector circuit which detects an object approaching the detector electrode and the earth electrode by detecting the capacitance between the detector electrode and the earth electrode. The detector electrode is formed in a shape such that it surrounds the earth electrode.

11 Claims, 10 Drawing Sheets

DETECTOR CIRCUIT

ELECTRICAL CAPACITANCE PROXIMITY SENSOR

BACKGROUND OF THE INVENTION

1. Field of the Invention

The present invention relates to an electrical capacitance proximity sensor which detects an approaching object by changes in capacitance. Priority is claimed on Japanese Patent Application No. 2004-145502, filed May 14, 2004, the content of which is incorporated herein by reference.

2. Description of the Related Art

Conventionally, an electrical capacitance proximity sensor is known (for example, Japanese Unexamined Patent Application, First Publication No. 2000-48694 (Paragraph 0006, 0012, FIG. 1, FIG. 2)), where a detector electrode and an earth electrode are formed on one face (detection face) of an insulating substrate, and a shield electrode is formed on an other face (back face) such that it covers a formation area of the detector electrode and the earth electrode, thereby concentrating electric lines of force on the detection face, so that the effect of an object on the side faces and the back face of the detection face are eliminated.

Such an electrical capacitance proximity sensor is furnished with a detector circuit which includes, an oscillation circuit which oscillates at a frequency based on the capacitance between the detector electrode and the earth electrode, and a judgment circuit which determines the oscillation frequency of the oscillation circuit, and the detector circuit detects changes in capacitance resulting from an object approaching the detector electrode and the earth electrode to thereby determine the presence of an object and distance.

In the above-mentioned conventional electrical capacitance proximity sensor, in anticipation of a shielding effect, the earth electrode is formed in a shape such that it surrounds the detector electrode. However, from experiments performed by the inventor, it has become clear that detection sensitivity is high near the detector electrode, and not near the earth electrode.

SUMMARY OF THE INVENTION

The present invention takes such points into consideration, with an object of providing an electrical capacitance proximity sensor with high detection sensitivity.

An electrical capacitance proximity sensor according to the present invention comprises; an insulating substrate; a detector electrode and earth electrode formed in a fixed pattern on one face of the insulating substrate; and a detector circuit which detects an object when it approaches the detector electrode and earth electrode by detecting the capacitance between the detector electrode and earth electrode, and the detector electrode is formed in a shape in which it surrounds the earth electrode.

In one embodiment of the present invention, the detector electrode is made in a letter C pattern which surrounds the earth electrode. Furthermore, in another embodiment of the present invention, the detector electrode comprises a first detector electrode and a second detector electrode separated symmetrically with the earth electrode as the center, and the detector circuit determines the direction in which the object is approaching from, according to a capacitance between the first detector electrode and the earth electrode, and a capacitance between the second detector electrode and the earth electrode. In yet another embodiment of the present invention, a shield material is formed on an other face of the insulating substrate, covering an entire formation area of the detector electrode and the earth electrode.

According to the present invention, since the detector electrode is formed to surround the earth electrode, the capacitance between the detector electrode and the earth electrode can be made high. As a result, the effects of external noise can be eliminated, and the change in capacitance resulting from the presence of an approaching object can be made high. Therefore, it is possible to provide an electrical capacitance proximity sensor capable of detecting over a wide area.

DETAILED DESCRIPTION OF THE INVENTION

Hereunder is a description of preferred embodiments of the present invention, with reference to the appended drawings.

Figure 1:
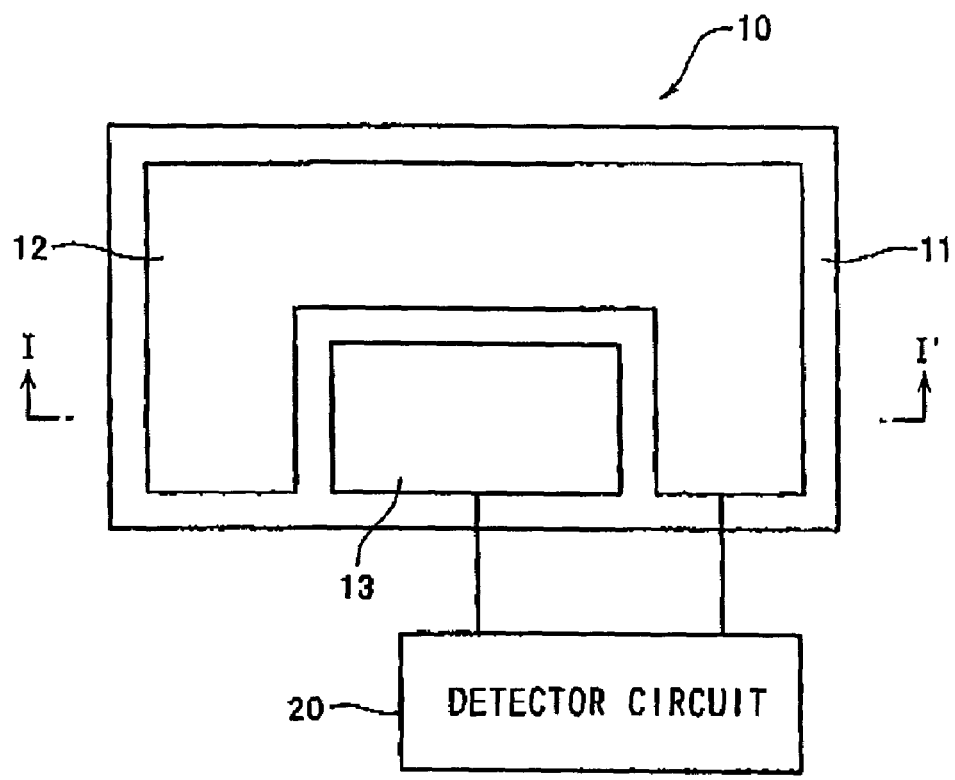
FIG. 1 is a diagram showing an outline configuration of an electrical capacitance proximity sensor according to an embodiment of the present invention.
Figure 2:
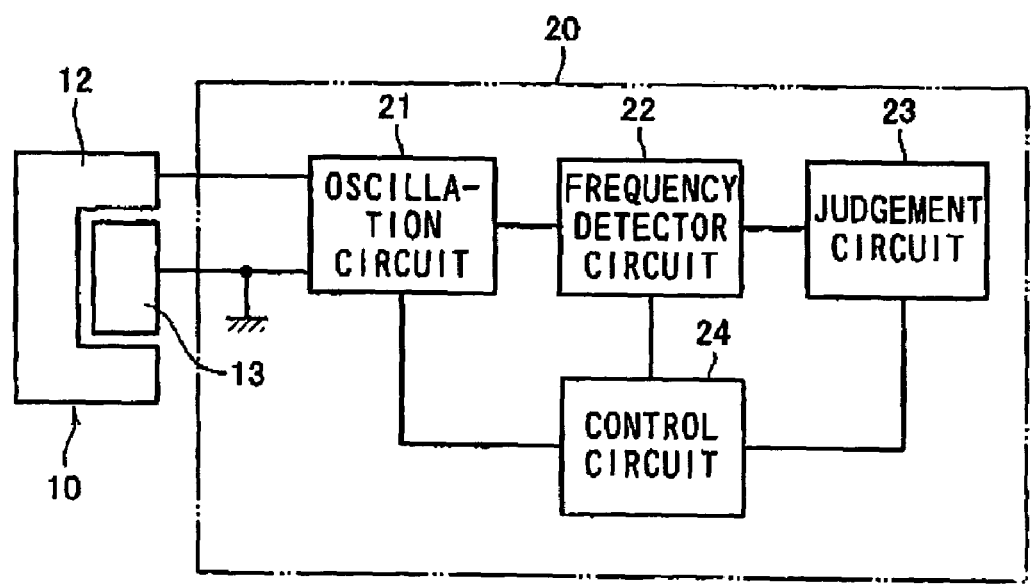
FIG. 2 is a block diagram showing details of a detection circuit of the proximity sensor.

FIG. 1 and FIG. 2 show an outline configuration of an electrical capacitance proximity sensor according to an embodiment of the present invention. This proximity sensor comprises a sensor section 10 and a detector circuit 20.

The sensor section 10 comprises a flexible printed circuit (FPC), a rigid printed circuit (RPC) and the like, which is furnished with; an insulating substrate 11 composed of an insulating material such as polyethelene terephthalate (PET), polyethelene naphthalate (PEN) or epoxy resin; and a copper, copper alloy or aluminum detector electrode 12 and earth electrode 13 formed in a pattern on the insulating substrate 11. The earth electrode 13 is square or rectangular, and the detector electrode 12 is formed in a letter C-type shape or pattern so that it surrounds the perimeter of the earth electrode 13 on at least most of both sides and the upper side.

The detector circuit 20, as shown in FIG. 2, comprises: an oscillation circuit 21 which changes its oscillation frequency according to the capacitance between the detector electrode 12 and the earth electrode 13; a frequency detector circuit 22 which detects the size of the oscillation output frequency of the oscillation circuit 21; a judgment circuit 23 which discriminates an approaching object, distance and the like based on the size of the frequency detected in the frequency detector circuit 22; and a control circuit 24 which controls these circuits. Here, an alternating voltage corresponding to the oscillation output is applied to the detector electrode 12 connected to the oscillation circuit 21, but the earth electrode 13 is fixed at earth potential. The frequency detector circuit 22 can be formed by a frequency-voltage transducer such as a low-pass filter which converts frequency into voltage, and a frequency counter which, for example, counts the rising edges of the oscillation output. The judgment circuit 23 can be formed by programmable devices such as a voltage comparator and a CPU. The control circuit 24 is, for example, a circuit for gain adjustment for amplifiers used in the oscillation circuit 21, the frequency detector circuit 22 and the judgment circuit 23. It may also be a circuit used for correction for external environment, such as temperature and humidity, and may be formed together with the judgment circuit 23.

The above is one example of a detector circuit 20, and in addition to the above, for example, an oscillation circuit which oscillates at a constant frequency, a one-shot multivibrator which changes the duty of the output pulse from the oscillation circuit using the capacitance of the detector electrode and the earth electrode, and a low-pass filter which outputs the average value of the output of the one-shot multivibrator, may be used to form the detector circuit.

Next is a description of the effect of the electrical capacitance proximity sensor configured in the above manner.

Embodiment 1

Figure 3:
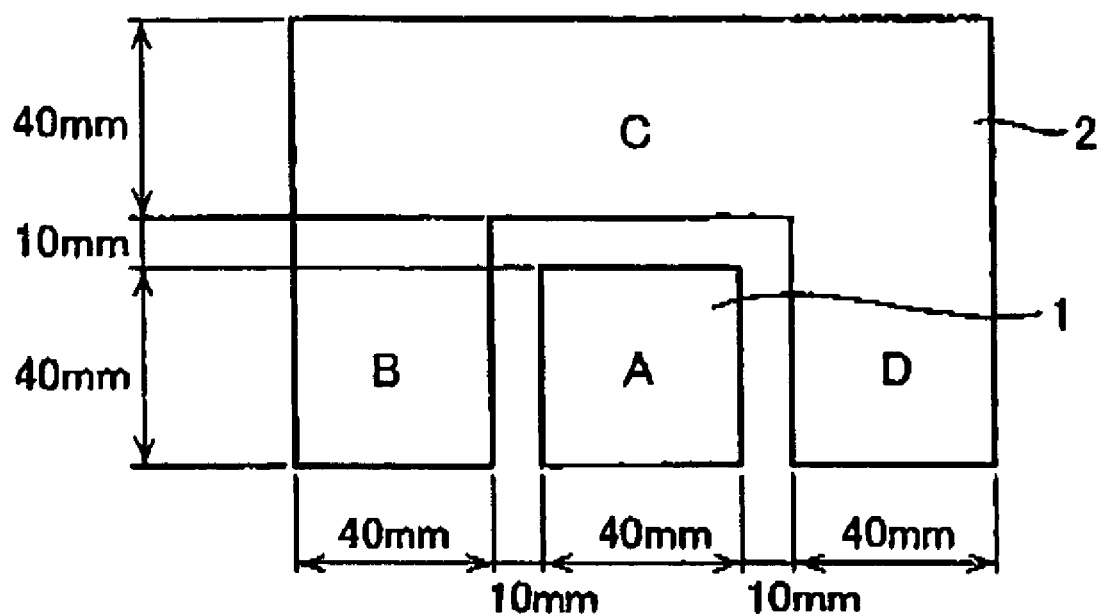
FIG. 3 is a plan view of an electrode of the proximity sensor according to examples 1 and 2, and comparative examples 1 and 2.
Figure 4A:
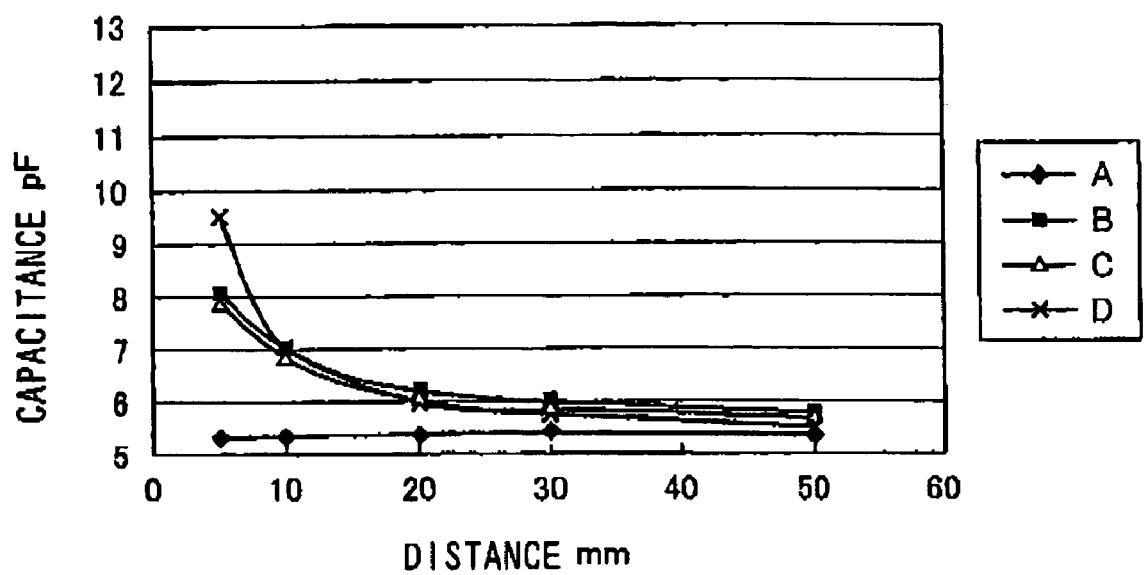
FIG. 4A and FIG. 4B are graphs showing a relationship between distance to the detection object and capacitance of the electrodes, being measurement results of examples 1 and 2, respectively.

As shown in FIG. 3, an electrode 1 of 40 mm sides has formed on its upper side and left and right sides, via a 10 mm gap, an electrode 2 of width 40 mm in a letter C shape. The electrode 1 is connected to earth potential and is the earth electrode. The electrode 2 is the detector electrode and is connected to a fixed feedback path of the circuit in FIG. 2. A flat earth electrode of 30 mm sides was brought close to each of the points A, B, C and D of FIG. 3, and the relationship between the distance to each of the points and the capacitance between the electrodes 1 and 2 was measured. Those results are shown in FIG. 4A. As shown in the figure, when the flat earth electrode of 30 mm sides, smaller than the central electrode 1, was brought close to the point A of the electrode 1 which is the earth electrode, no change in capacitance was observed at all. On the other hand, after being brought closer than a distance of 20 mm to each of the points B, C, D of the letter C shape electrode 2, which is the detector electrode, the capacitance itself and its change was large, varying between 6 to 10 pF, thus confirming excellent detector sensitivity.

Embodiment 2

Figure 4B:
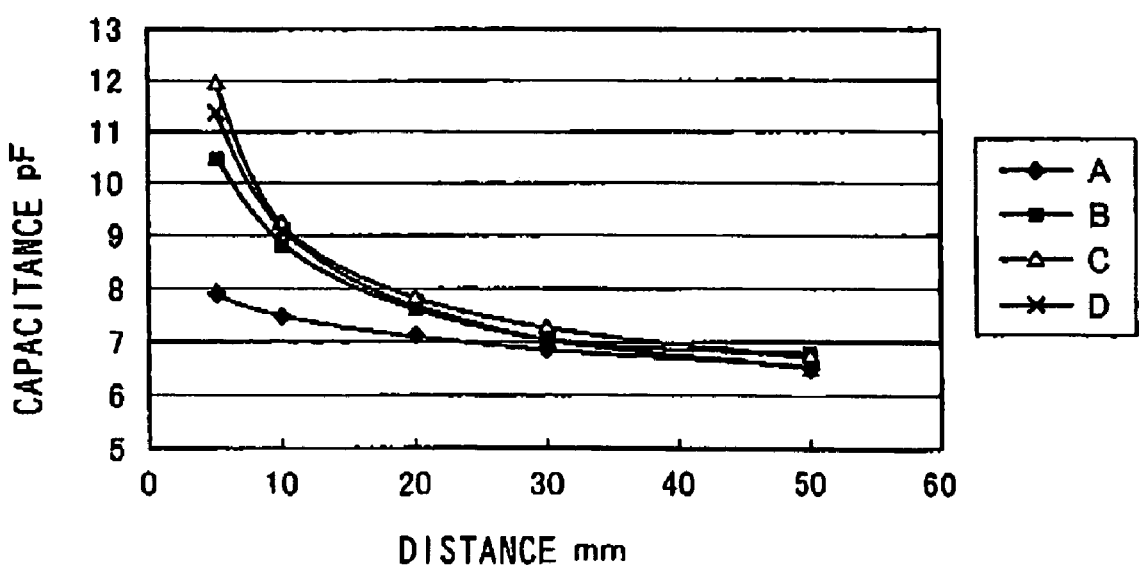

The earth electrode being brought close to the electrodes 1 and 2 of FIG. 3 was changed to one of 50 mm sides, and measurements were conducted as for embodiment 1. Those results are shown in FIG. 4B. In this manner, when the earth electrode being brought close was made larger than the electrode 1, even at point A of the electrode 1, a slight change in capacitance was observed. Furthermore, after being brought closer than a distance of 20 mm to each of the points B, C and D of the letter C shape electrode 2, which is the detector electrode, the change in capacitance became 7.5 to 12 pF. Thus a larger capacitance and capacitance change than embodiment 1 was observed.

COMPARATIVE EXAMPLE 1

In Comparative Example 1, the electrode 1 was changed to become the detector electrode, and the electrode 2 was changed to become the earth electrode. Otherwise, measurements were conducted as for embodiment 1. Those results are shown in FIG. 5A.

COMPARATIVE EXAMPLE 2

In Comparative Example 2, the electrode 1 was changed to become the detector electrode, and the electrode 2 was changed to become the earth electrode. Otherwise, measurements were conducted as for embodiment 2. Those results are shown in FIG. 5B.

Figure 5A:
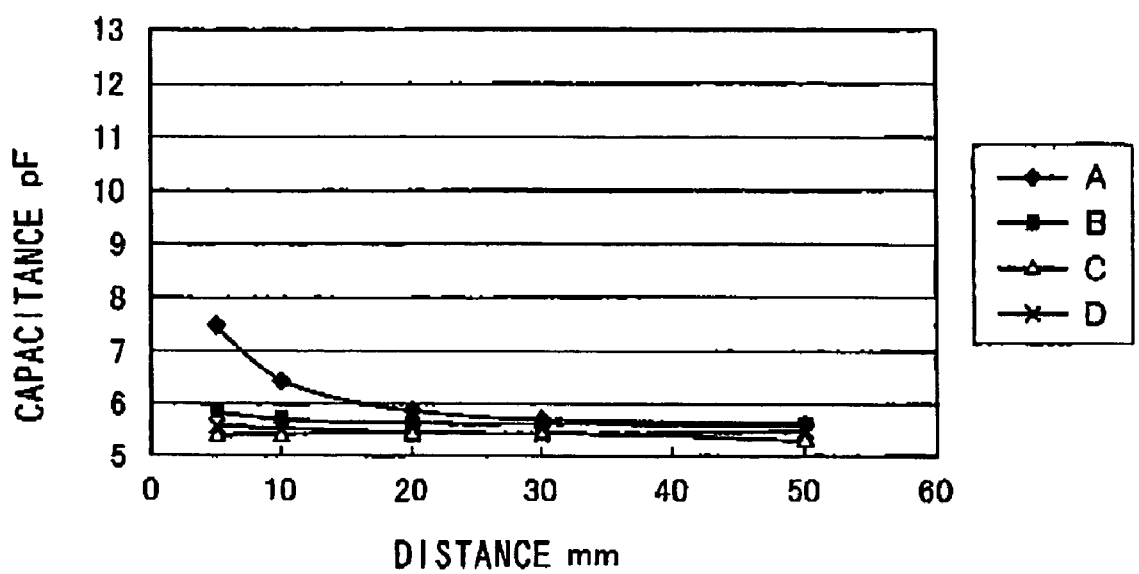
FIG. 5A and FIG. 5B are graphs showing a relationship between distance to the detection object and capacitance of the electrodes, being measurement results of comparative examples 1 and 2, respectively.
Figure 5B:
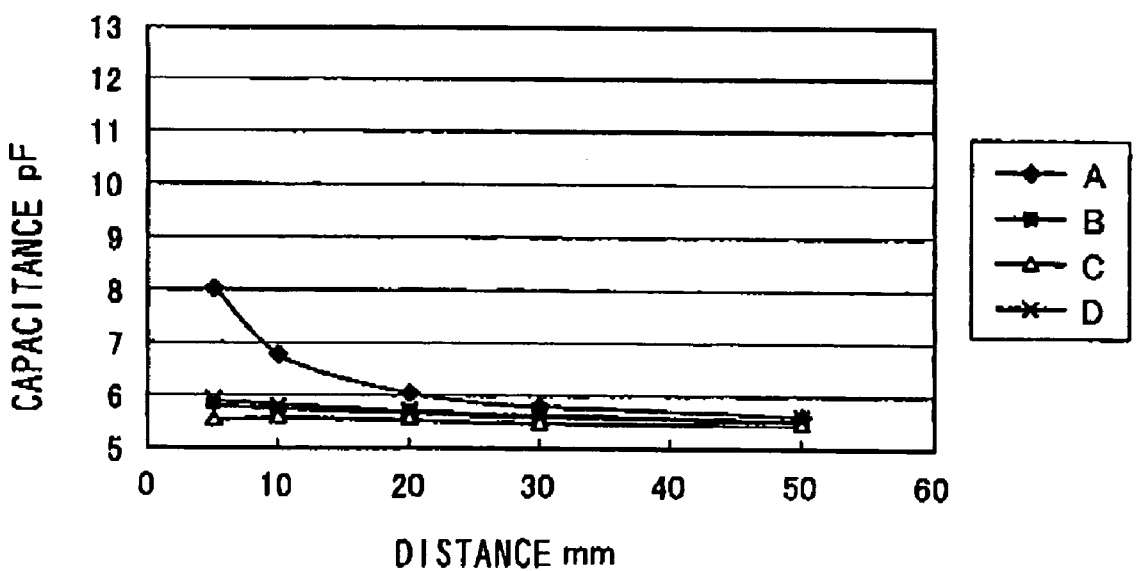

As is clear from FIGS. 5A and 5B, a change in capacitance was only observed for point A of the electrode 1, and the capacitance and its change was small, and in the range of 6 to 7.5 pF in comparative example 1, and 6 to 8 pF in comparative example 2, and both detector sensitivity and detector range were comparatively worse than in embodiment 1 and 2.

COMPARATIVE EXAMPLE 3

Figure 6:
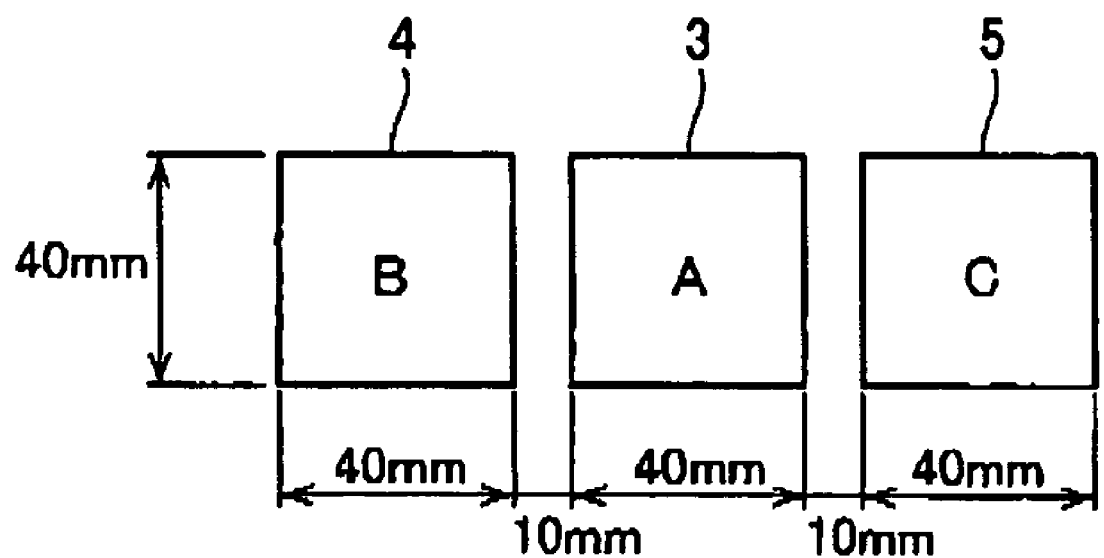
FIG. 6 is a plan view of an electrode according to comparative examples 3 and 4 of the proximity sensor.

As shown in FIG. 6, three electrodes 3, 4 and 5, of 40 mm sides were set in a line, leaving a 10 mm gap, in a state where the electrode 3 was made the earth electrode, the electrode 4 was made the detector electrode, and the electrode 5 was made to have nothing connected to it. A flat earth electrode of 30 mm sides was brought close to each of the points A, B and C and the change in capacitance was measured. Those results are shown in FIG. 7A.

COMPARATIVE EXAMPLE 4

For the same free electrodes 3, 4 and 5 as comparative example 3, the same measurements as comparative example 3 were performed in a state where the electrode 3 was made the earth electrode, the electrode 5 was made the detector electrode, and the electrode 4 was made to have nothing connected to it. Those results are shown in FIG. 7B.

Figure 7A:
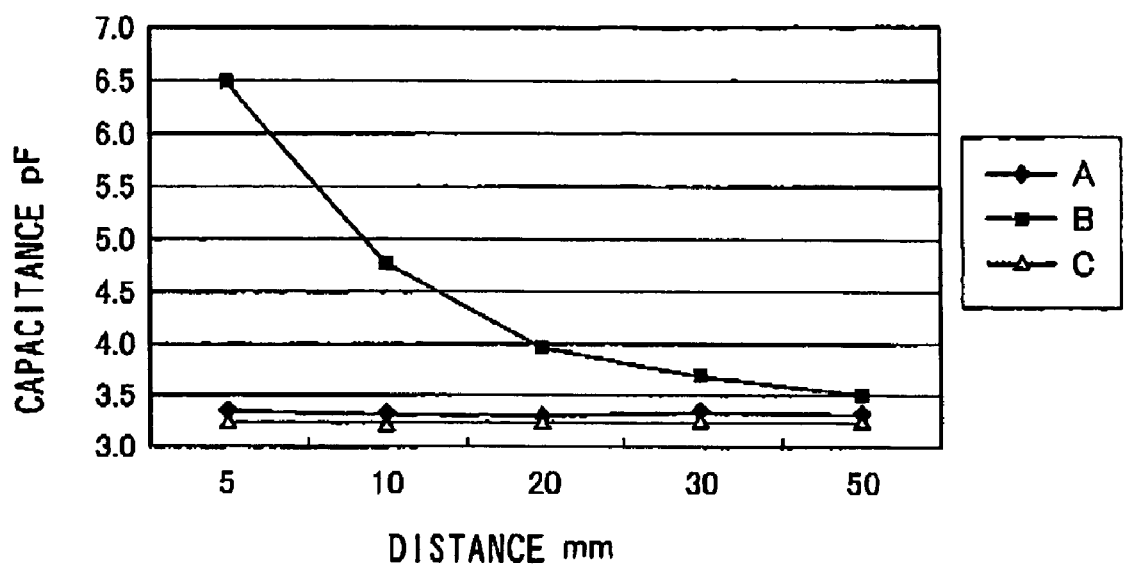
FIG. 7A and FIG. 7B are graphs showing a relationship between distance to the detection object and capacitance of the electrodes, being measurement results of examples 3 and 4, respectively.
Figure 7B:
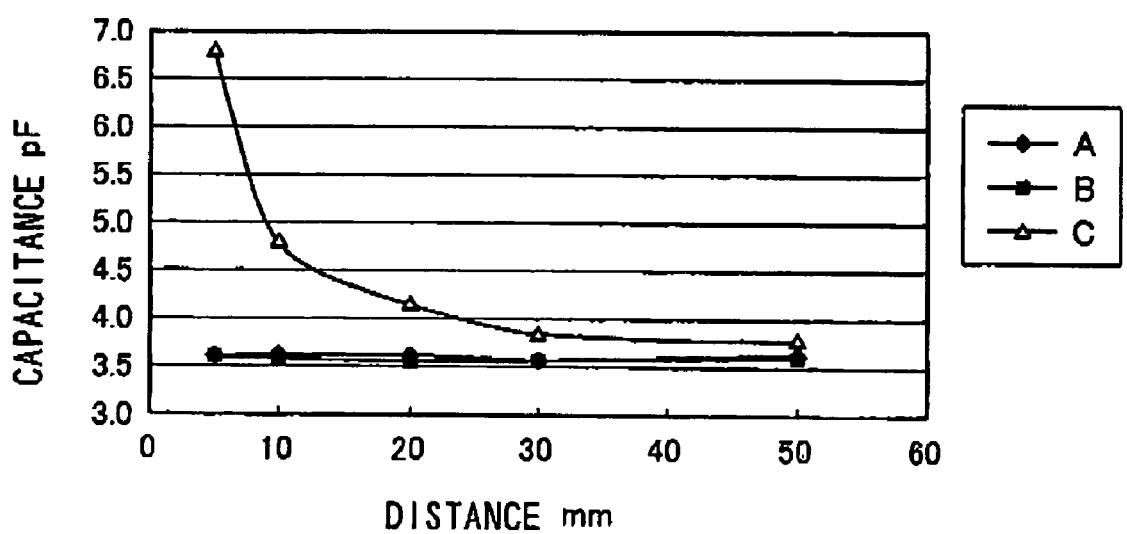

As is clear from FIGS. 7A and 7B, a change in capacitance was only observed for points B and C of the detector electrode, and the capacitance itself was small, in the range of 3.5 to 6.5 pF and 3.8 to 6.8 pF.

As mentioned above, according to the present embodiment of the electrical capacitance proximity sensor, the effect where this has a high detector sensitivity, and is strong against external noise, can be demonstrated.

Furthermore, in FIG. 1, to increase the detector sensitivity of the detector electrode 12, a shield which faces the back face of the electrode is effective.

Figure 8:
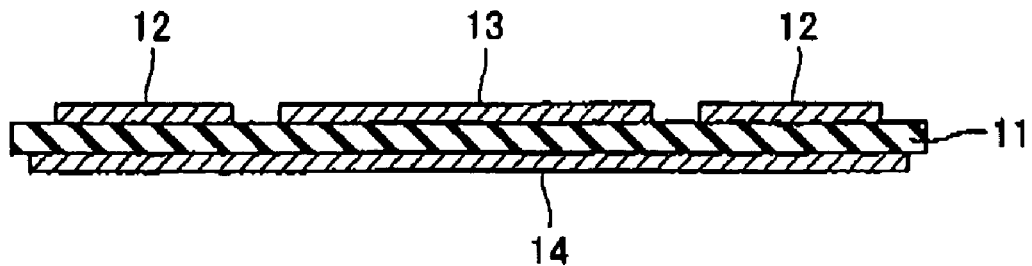
FIG. 8 is a cross-sectional view showing an example of an I–I' cross-section of FIG. 1.

FIG. 8 is an I–I' cross-sectional view of the sensor section 10 of FIG. 1. The undersurface of the insulating substrate 11 has a shield material 14 formed such that it covers the entire formation area of the detector electrode 12 and the earth electrode 13. Therefore, the effect of the electric lines of force on the back of the insulating substrate can be eliminated, and the noiseproof property can be improved.

Figure 9:
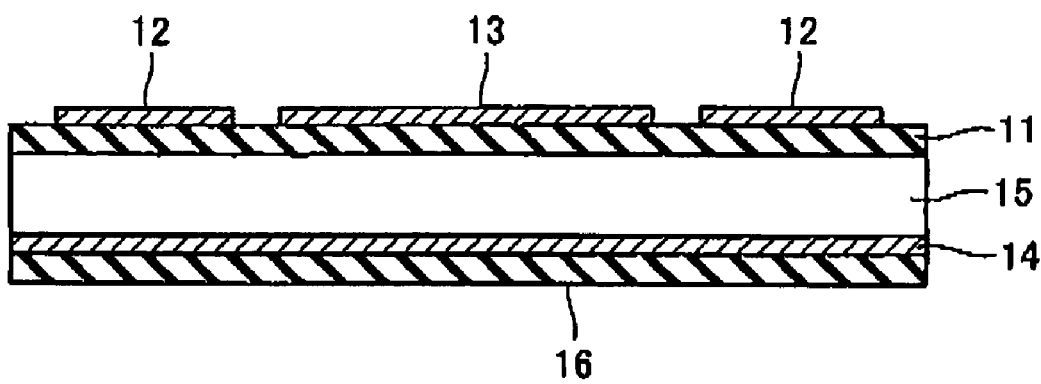
FIG. 9 is a cross-sectional view showing another example of an I–I' cross-section of FIG. 1.

FIG. 9 is an example where an insulating material 16 with a shield material 14 formed thereon, is set on the underside of the insulating substrate 11 via a spacer 15 composed of insulating material. That is to say, when the insulating substrate 11 is, for example, a membrane sheet of about 75 μm, the detector electrode 12 and the shield material 14 may be too close together, and the electric lines of force may become too concentrated between them. Therefore, by putting a spacer 15 between them, the electric lines of force on the upper surface can be increased and detection sensitivity can be further increased.

Figure 10:
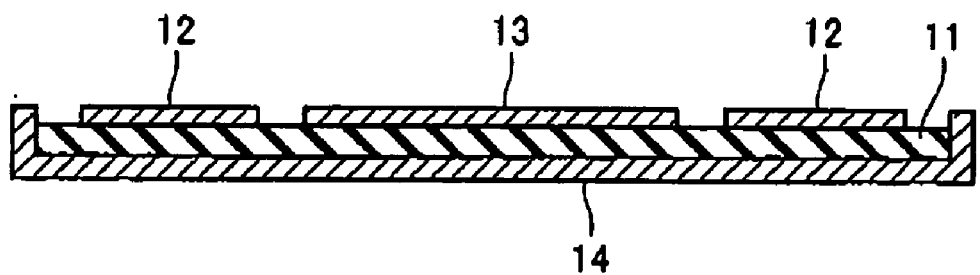
FIG. 10 is a cross-sectional view showing yet another example of an I–I' cross-section of FIG. 1.
Figure 11:
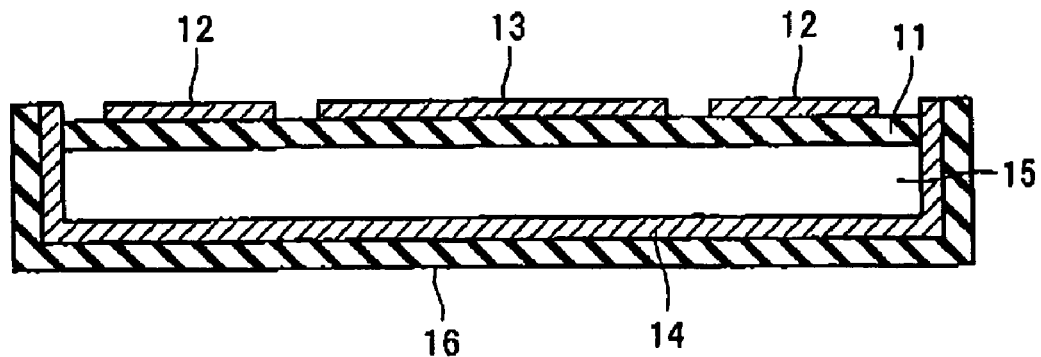
FIG. 11 is a cross-sectional view showing yet another example of an I–I' cross-section of FIG 1.

FIG. 10 is an example in which the shield material 14 of FIG. 8 is lengthened to a height to enclose not only the underside of the insulating substrate 11, but also the electrodes 12 and 13. FIG. 11 is an example in which the shield material 14 and the insulating material 16 of FIG. 9 have been lengthened to a height to enclose not only the sides of the spacer 15, but also the electrodes 12 and 13. By covering the sides of the electrodes 12 and 13 with the shield material 14 as in these examples, it is possible to eliminate the effects of the underside even more completely.

Figure 12:
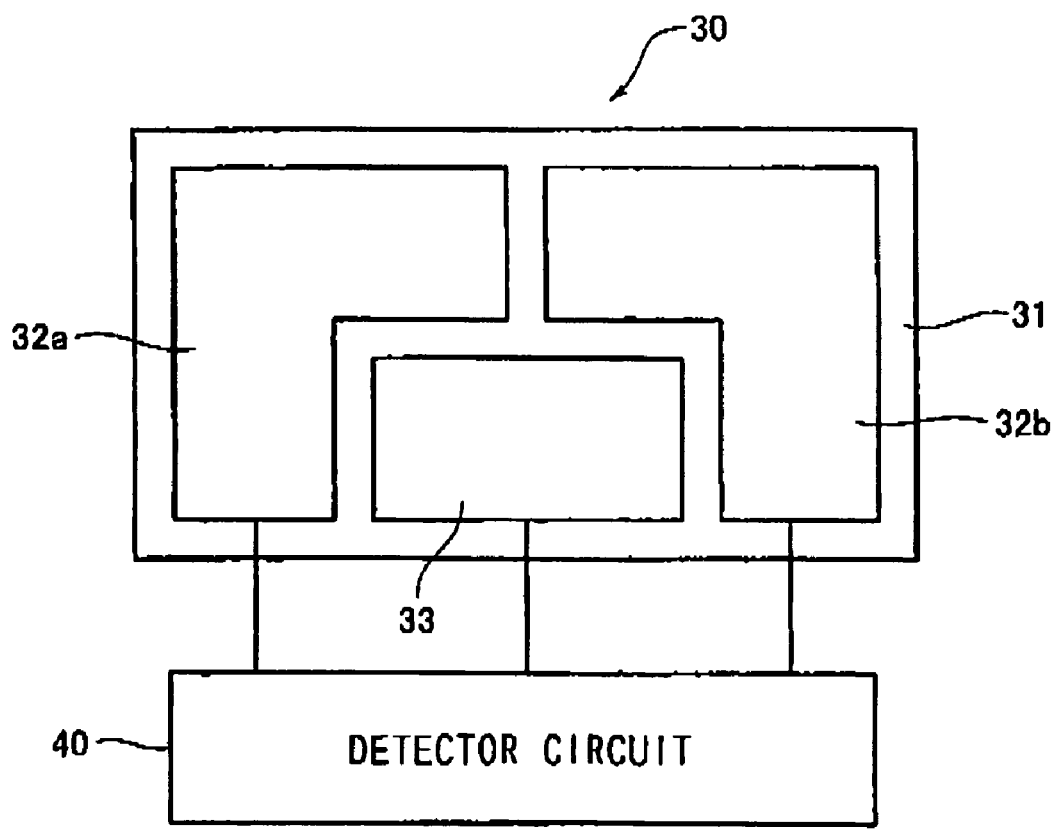
FIG. 12 is a drawing showing an outline configuration of an electrical capacitance proximity sensor according to another embodiment of the present invention.
Figure 13:
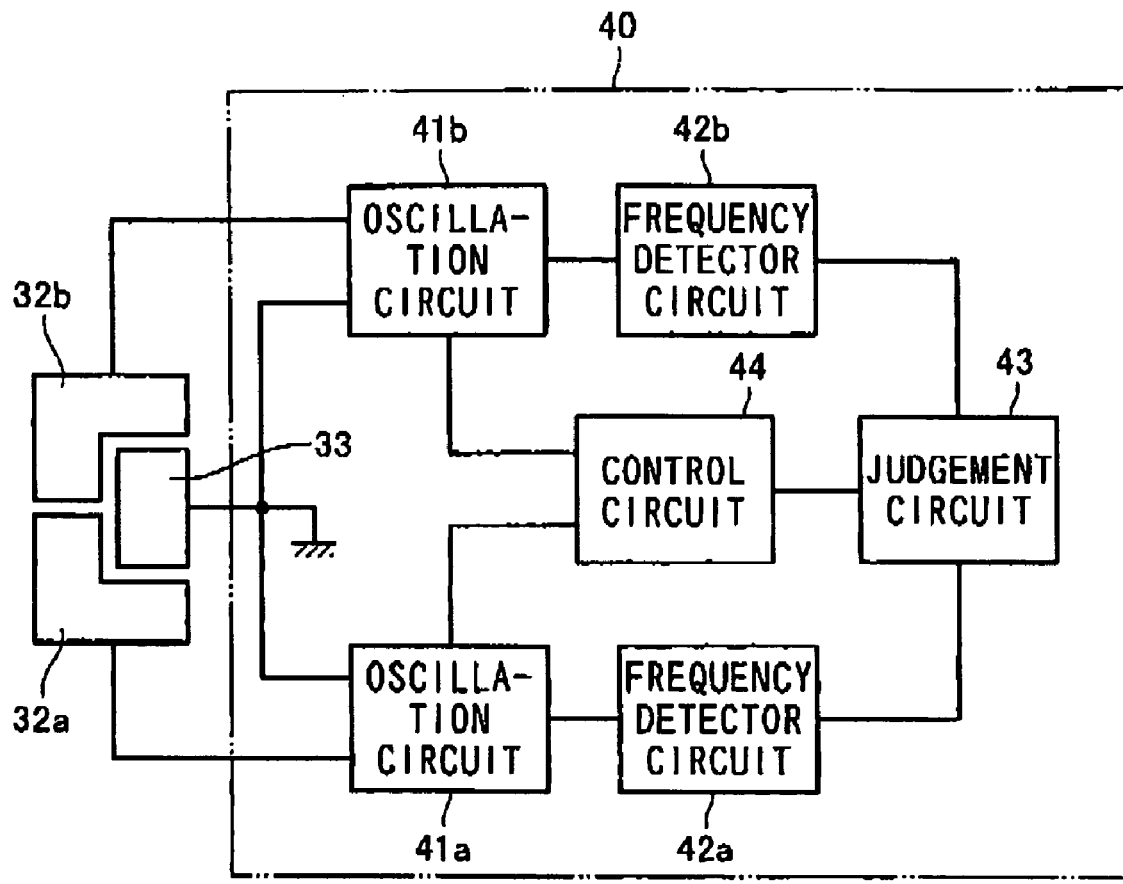
FIG. 13 is a block diagram showing details of a detector circuit of the proximity sensor.

FIG. 12 and FIG. 13 are drawings showing the outline specification of a proximity capacitance sensor according to another embodiment of the present invention. In this embodiment, there is a difference to the previous embodiment in that the detector electrode which constitutes a sensor section 30 is separated into two detector electrodes, and a detector circuit 40 determines the approach of an object, distance, and direction of movement, with the two detector electrodes.

The sensor section 30 is furnished with an insulating substrate 31, detector electrodes 32a and 32b in a pattern formation on the insulating substrate 31, and an earth electrode 33. The earth electrode 33 is square or rectangular, and the detector electrode 32a is formed such that it surrounds the earth electrode 33 on its left side and the left half of its upper side, and the detector electrode 32b is formed such that it surrounds the earth electrode 33 on its right side and the right half of its upper side, in respective letter L shapes.

The detector circuit 40, as shown in FIG. 13, comprises an oscillation circuit 41a which changes its oscillation frequency according to capacitance between the detector electrode 32a and the earth electrode 33; an oscillation circuit 41b which changes its oscillation frequency according to capacitance between the detector electrode 32b and the earth electrode 33; frequency detector circuits 42a and 42b which detect the size of the respective oscillation output frequencies of the oscillation circuits 41a and 41b; a judgment circuit 43 which determines the approach of an object, distance, and direction of movement and the like based on the size of the frequency detected from the frequency detector circuits 42a and 42b; and a control circuit 44 which controls the circuits.

In this embodiment, when an object moves from left to right in FIG. 12, the capacitance of the detector electrode 32b changes after the capacitance of the detector electrode 32a changes, and conversely, when an object moves from right to left in FIG. 12, the capacitance of the detector electrode 32a changes after the capacitance of the detector electrode 32b changes, thereby enabling the direction of movement of the object to be detected.

The present invention is not limited to the embodiments stated above.

Figure 14:
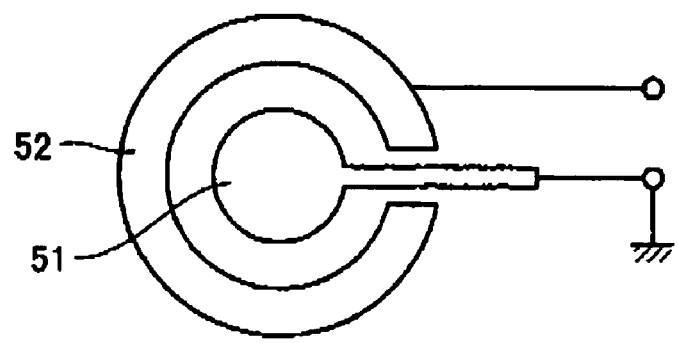
FIG. 14 is a plan view showing an electrode according to yet another embodiment of the present invention.
Figure 15:
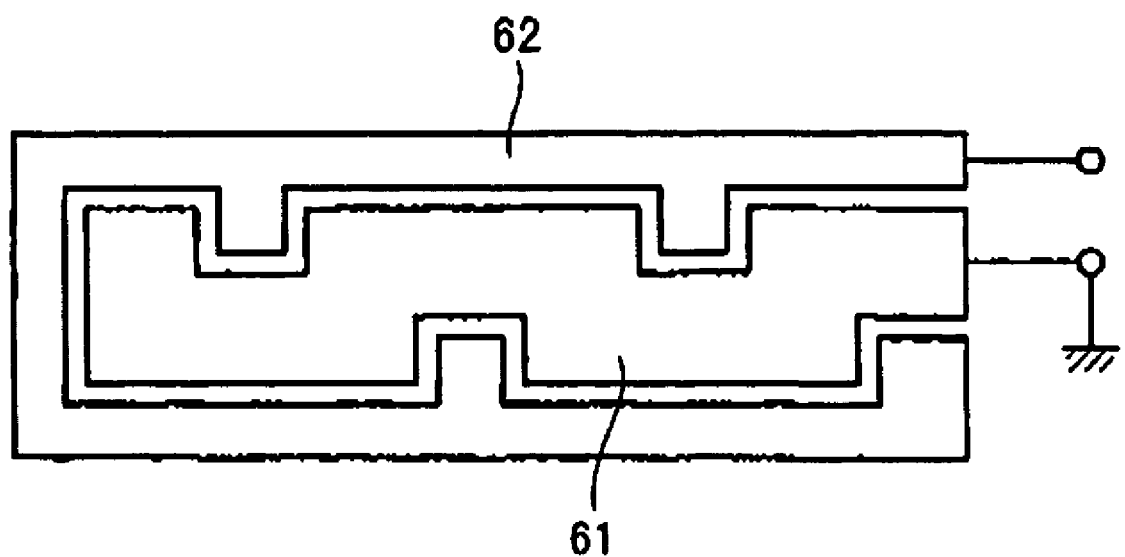
FIG. 15 is a plan view showing an electrode according to yet another embodiment of the present invention.

For example, for the shape of the electrodes, a pattern as shown in FIG. 14 with a circular earth electrode 51, and an annular detector electrode 52 which surrounds the circumference of the earth electrode 51 arranged on concentric circles except for the area connecting the earth electrode to the detector circuit may be used. Moreover, as shown in FIG. 15, a pattern where an earth electrode 61 of a rectangular wave type shape is surrounded on at least most of three of its four perimeter sides by a corresponding rectangular type detector electrode 62 may be used.

In short, the present invention is characterized by the detector electrode being formed in a shape which surrounds the earth electrode, and various modifications are possible without departing from the spirit or scope of the present invention.

What is claimed is:

1. An electrical capacitance proximity sensor comprising;
   an insulating substrate;
   a detector electrode and an earth electrode formed in a fixed pattern on one face of said insulating substrate;
   a detector circuit which detects an object when it approaches said detector electrode and said earth electrode by detecting the capacitance between said detector electrode and said earth electrode;
   a spacer composed of a first insulating material disposed on an other face of said insulating substrate;
   a shield material disposed on the spacer and opposing the other face of said insulating substrate such that the spacer is provided between the insulating substrate and the shield material; and
   a second insulating material disposed on the shield material on a face opposing the spacer,
   wherein said detector electrode is formed in a shape in which it surrounds said earth electrode.

2. The electrical capacitance proximity sensor according to claim 1, wherein said detector electrode is made in a letter C pattern which surrounds the perimeter of said earth electrode on at least most of both sides and the upper side.

3. The electrical capacitance proximity sensor according to claim 1, wherein said detector electrode comprises a first detector electrode and a second detector electrode separated symmetrically with said earth electrode as the center, and said detector circuit determines the direction which said object is approaching from, according to a capacitance between said first detector electrode and said earth electrode, and a capacitance between said second detector electrode and said earth electrode.

4. The electrical capacitance proximity sensor according to claim 2, wherein said detector electrode comprises a first detector electrode and a second detector electrode separated symmetrically with said earth electrode as the center, and said detector circuit determines the direction which said object is approaching from, according to a capacitance between said first detector electrode and said earth electrode, and a capacitance between said second detector electrode and said earth electrode.

5. The electrical capacitance proximity sensor according to claim 1, wherein said shield material is formed on said other face of said insulating substrate, covering an entire formation area of said detector electrode and said earth electrode.

6. The electrical capacitance proximity sensor according to claim 1, wherein said detector electrode is made in an annular pattern which surrounds the circumference of said earth electrode arranged on the concentric circles except for an area connecting said earth electrode to said detector circuit.

7. The electrical capacitance proximity sensor according to claim 1, wherein said earth electrode is made in a rectangular wave type pattern and said detector electrode is formed in a corresponding rectangular type shape to surround said earth electrode on at least most of three of its four perimeter sides.

8. The electrical capacitance proximity sensor according to claim 5, wherein said shield material is lengthened to a height to enclose not only an underside of said insulating substrate, but also said detector electrode and said earth electrode.

9. The electrical capacitance proximity sensor according to claim 1, wherein said shield material and said second insulating material are lengthened to a height to enclose not only the sides of said spacer, but also said detector electrode and said earth electrode.

10. The electrical capacitance proximity sensor according to claim 1, wherein said detector circuit comprises an oscillation circuit which changes its oscillation frequency according to the capacitance between said detector electrode and said earth electrode; a frequency detector circuit which detects the size of the oscillation output frequency of said oscillation circuit; a judgment circuit which discriminates an approaching object, distance and the like based on the size of the frequency detected in said frequency detector circuit; and a control circuit which controls said circuits.

11. The electrical capacitance proximity sensor according to claim 1, wherein said earth electrode is a square or rectangular type shape, said detector electrode comprises a first detector electrode and a second detector electrode separated symmetrically with said earth electrode as the center, said detector circuit determines the direction which said object is approaching from, according to a capacitance between said first detector electrode and said earth electrode, and a capacitance between said second detector electrode and said earth electrode, a first side of the earth electrode is surrounded by the first detector electrode, a second side of the earth electrode is surrounded by the second detector electrode, a part of a third side of the earth electrode is surrounded by the first detector electrode, and another part of the third side of the earth electrode is surrounded by the second detector electrode.

* * * * *